United States Patent
Ukai et al.

(10) Patent No.: US 10,198,179 B2
(45) Date of Patent: Feb. 5, 2019

(54) PROGRAM FOR CHARACTER INPUT SYSTEM, CHARACTER INPUT DEVICE, AND INFORMATION PROCESSING DEVICE

(71) Applicant: OMRON CORPORATION, Kyoto-shi, Kyoto (JP)

(72) Inventors: Kenichi Ukai, Otsu (JP); Takuya Nakayama, Kyoto (JP); Mayu Nakano, Yokohama (JP); Tomoya Sakata, Kyoto (JP)

(73) Assignee: OMRON CORPORATION, Kyoto-Shi, Kyoto (JP)

( * ) Notice: Subject to any disclaimer, the term of this patent is extended or adjusted under 35 U.S.C. 154(b) by 44 days.

(21) Appl. No.: 15/510,896

(22) PCT Filed: Jan. 14, 2016

(86) PCT No.: PCT/JP2016/050942
§ 371 (c)(1),
(2) Date: Mar. 13, 2017

(87) PCT Pub. No.: WO2016/139973
PCT Pub. Date: Sep. 9, 2016

(65) Prior Publication Data
US 2017/0277430 A1 Sep. 28, 2017

(30) Foreign Application Priority Data
Mar. 3, 2015 (JP) .................. 2015-041142

(51) Int. Cl.
*G06F 3/048* (2013.01)
*G06F 3/0488* (2013.01)
(Continued)

(52) U.S. Cl.
CPC .......... *G06F 3/04886* (2013.01); *G06F 3/018* (2013.01); *G06F 3/0236* (2013.01);
(Continued)

(58) Field of Classification Search
CPC .. G06F 3/0482; G06F 3/04886; G06F 3/0237; G06F 3/0236
See application file for complete search history.

(56) References Cited

U.S. PATENT DOCUMENTS

| | | | |
|---|---|---|---|
| 5,977,948 A | 11/1999 | Nishibori | |
| 9,213,467 B2 * | 12/2015 | Li | ................ G06F 3/04886 |

(Continued)

FOREIGN PATENT DOCUMENTS

| | | | |
|---|---|---|---|
| JP | 2003076478 A | 3/2003 | |
| JP | 2005196250 A | 7/2005 | |

(Continued)

OTHER PUBLICATIONS

International Search Report dated May 24, 2016 for corresponding foreign Application No. PCT/JP2016/050942, 1 pp.
(Continued)

*Primary Examiner* — Haoshian Shih
(74) *Attorney, Agent, or Firm* — United IP Counselors, LLC

(57) ABSTRACT

A non-transitory computer readable medium includes a character input system including a first band-shaped key area displayed including the characters of character groups including representative characters lined up one by one. When a touch point is detected in this area, a second band-shaped key area is displayed including the characters of the group including the representative characters lined up at that detection position. When movement of a touch point from the first band-shaped key area to the second band-shaped key area is detected, a band-shaped candidate area is displayed including candidate character strings matching the characters in a line at that movement position. These areas are arranged in the width direction and with their orientations aligned. When the touch point disappears after moving from the second band-shaped key area to the band-shaped (Continued)

candidate area, the candidate character string displayed at that disappearance position is confirmed as the input character string.

10 Claims, 8 Drawing Sheets

(51) Int. Cl.
    *G06F 3/0482*      (2013.01)
    *G06F 3/01*      (2006.01)
    *G06F 3/023*      (2006.01)
    *H03M 11/04*      (2006.01)

(52) U.S. Cl.
    CPC .......... *G06F 3/0237* (2013.01); *G06F 3/0482* (2013.01); *G06F 3/04883* (2013.01); *H03M 11/04* (2013.01)

(56) References Cited

U.S. PATENT DOCUMENTS

| | | | | |
|---|---|---|---|---|
| 2005/0140661 A1* | 6/2005 | Collins | ................ | G06F 3/0482 345/173 |
| 2011/0050628 A1* | 3/2011 | Homma | ................ | G06F 3/0236 345/174 |
| 2013/0021286 A1* | 1/2013 | Sudo | ................ | G06F 3/018 345/173 |
| 2013/0194187 A1* | 8/2013 | Pasquero | ............ | G06F 3/04883 345/168 |
| 2013/0241838 A1 | 9/2013 | Onishi et al. | | |
| 2013/0305178 A1* | 11/2013 | Matsuzawa | ........... | G06F 3/0237 715/773 |
| 2015/0121285 A1* | 4/2015 | Eleftheriou | ......... | G06F 3/04842 715/773 |

FOREIGN PATENT DOCUMENTS

| | | |
|---|---|---|
| JP | 2009181531 A | 8/2009 |
| JP | 2012003545 A | 1/2012 |
| JP | 2014175689 A | 9/2014 |
| JP | 2014178953 A | 9/2014 |

OTHER PUBLICATIONS

Extended European Search Report dated Sep. 6, 2018 for corresponding European Application No. 16758669.2, 9 pp.

* cited by examiner

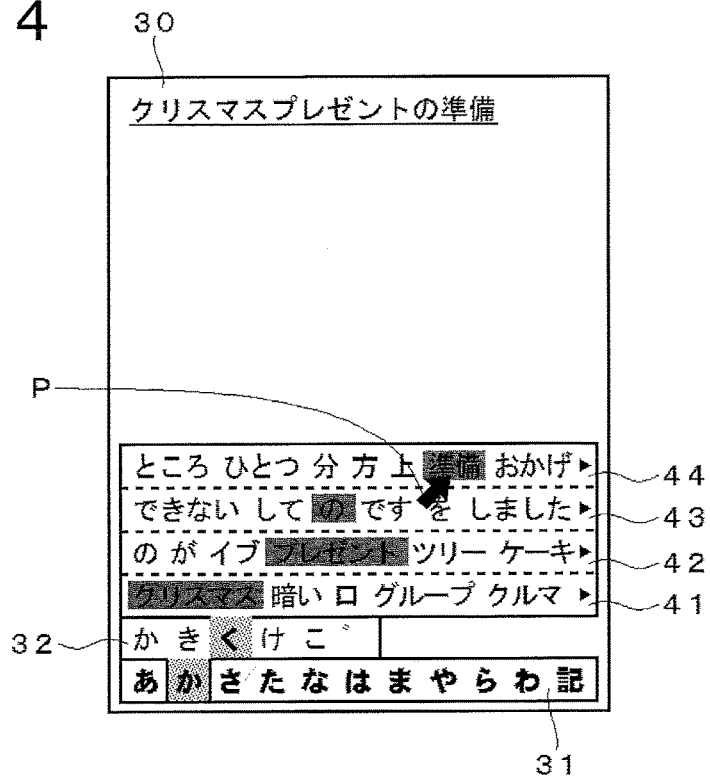

PROGRAM FOR CHARACTER INPUT SYSTEM, CHARACTER INPUT DEVICE, AND INFORMATION PROCESSING DEVICE

CROSS-REFERENCE TO RELATED APPLICATIONS

This application is the U.S. National Phase of PCT International Application No. PCT/JP2016/050942, filed on Jan. 14, 2016. That application claims priority to Japanese Patent Application No. 2015-041142, filed Mar. 3, 2015. The contents of both applications are herein incorporated by reference in their entirety.

BACKGROUND

Technical Field

The present invention relates to a program that gives a computer connected to a touch screen the function of a character input device that inputs character information to an application that runs on the computer, as well as to a character input device and an information processing device equipped with a touch screen that use the program.

Description of Related Art

There has been widespread use of technology for displaying a virtual keyboard on a touch screen or other such display device, and receiving an operation to select characters on this virtual keyboard as a character input operation. Such prior art includes ensuring a display area on the screen of an application by means of a virtual keyboard on which the characters to be inputted are lined up, and devising the configuration of the virtual keyboard so as to enhance the efficiency of character input work.

For instance, Japanese Laid-Open Patent Application 2003-76478 states that a first keyboard is displayed in which the leading character in each row of the Japanese syllabary are lined up as representative characters, and when one of the characters in this first keyboard (such as "あ") has been selected, a second keyboard is displayed in which the characters other than the representative character in the row for which the selected character is the representative character (such as "い," "う," "え," and "お") are lined up. The first and second keyboards are both a band-shaped area, and they may be disposed at a right angle to one another, or they may be disposed parallel to one another (see FIGS. 3 and 5, paragraphs 0011 to 0017, etc., in Japanese Laid-Open Patent Application 2003-76478).

Japanese Laid-Open Patent Application 2012-3545 states that a plurality of representative characters are arranged in an arc within a fan-shaped area, and in response to an operation in which one of the representative characters is tapped, the characters within the row corresponding to the character designated by this operation are displayed lined up to the inside of the row of representative characters, and a tap on the inside row is received as a character input operation (see FIGS. 4 and 6, paragraphs 0031 and 0033, etc., in Japanese Laid-Open Patent Application 2012-3545). Furthermore, it is stated in Japanese Laid-Open Patent Application 2012-3545 that, in response to a character input operation being performed, the inputted character is displayed, and candidate character strings that can be converted from that character are displayed on the outside of the fan-shaped area, allowing for the selection of a candidate character string to be received (see FIG. 7, paragraphs 0047 to 0049, etc., in Japanese Laid-Open Patent Application 2012-3545).

Ways to improve the efficiency of character input work are not limited to those related to virtual keyboards as discussed above. For example, one widely used method involves receiving the selection of a candidate after displaying a candidate area in which are arranged as candidate character strings those character strings that can be inputted following the input character string confirmed in response to the confirmation of an input character string (hereinafter a candidate of this type will be referred to as a "linked candidate") (see Japanese Laid-Open Patent Application 2014-178953).

SUMMARY

With the inventions discussed in Japanese Laid-Open Patent Application 2003-76478 and Japanese Laid-Open Patent Application 2012-3545, after a character has been selected by tapping or some other such operation on the line of the representative characters, the same selection operation has to be performed again on the line of characters in the row in which the selected character is the representative character, which makes the operation complicated. Also, the candidate character string displayed with the invention discussed in Japanese Laid-Open Patent Application 2012-3545 is not displayed until after the character input has been finished by the second character selection operation, so an operation has to be separately performed to select the candidate character string. Similarly, a linked candidate is not displayed until after a selection operation has been performed in the candidate area one stage earlier, so the selection operation has to be repeated a number of times.

The present invention is focused on the above problems, and it is an object thereof to improve the convenience of character input by reducing the amount of work entailed by inputting in character string units.

A computer into which the program of the present invention has been loaded will function as a character input device comprising an input character reception means for displaying on a touch screen a key area in which a plurality of characters are arranged, and receiving as an input character a character that complies with the detection status of a touch point for the key area, a candidate display means for displaying on the touch screen a candidate area that includes candidate character strings that match the input character received by the input character reception means, and a confirmation means for confirming as the input character string a specific candidate character string that complies with the detection status of a touch point for the candidate area.

With the first character input device pertaining to the present invention, the input character reception means has a first key area display means for displaying at a specific position on the touch screen a first band-shaped key area in which the representative characters of a plurality of character groups in which the representative characters are given one by one are lined up, and a second key area display means for displaying, in response to the detection of a touch point at the display position of one of the characters within the first band-shaped key area, a second band-shaped key area in which characters including representative characters in character groups in which said representative characters are the characters displayed at this detection position are lined up, so that this second band-shaped key area is adjacent to the first band-shaped key area in the width direction and will match the orientation of the first band-shaped key area.

The candidate display means of the first character input device, in response to the movement of a touch point detected in the first band-shaped key area to the display position of one of the characters in the second band-shaped key area, displays a band-shaped candidate area in which candidate character strings that match the character displayed at that movement position are lined up, so that this band-shaped candidate area matches the orientation of the second band-shaped key area and is adjacent to the second band-shaped key area on the opposite side from the first band-shaped key area. Also, the confirmation means, in response to the disappearance of the touch point that had moved to the second band-shaped key area at the display position of one of the candidate character strings after moving to the band-shaped candidate area, confirms as the input character string the candidate character string displayed at that disappearance position.

With the above configuration, when the user touches a finger to the display position of one of the characters in the first band-shaped key area in which the representative characters of the various groups are lined up, a second band-shaped key area is displayed in which the characters in the group in which the character at the touch position is the representative character are lined up. If the user slides the touching finger to the second band-shaped key area without lifting the finger, a band-shaped candidate area is displayed in which a candidate character strings that match the character displayed at the position of the finger after this slide are lined up. The user can slide the finger that is touching the first band-shaped key area, through the second band-shaped key area, to the band-shaped candidate area, and then lift that finger from the touch screen at the display position of the targeted candidate character string, to confirm the candidate character string as the input character string. Since the above three band-shaped areas are arranged in order in the width direction and with their orientations aligned, movement between the areas can be performed by a slide operation along a constant direction, and the amount of operation required for this movement can also be reduced. Also, the input of a character string can be completed with a single slide operation.

The following first to fourth embodiments can be provided for the first character input device. In the first embodiment, the first key area display means displays the first band-shaped key area, which is formed linearly, to conform to one edge of the touch screen within its rectangular display area. The second key area display means displays the second band-shaped key area, which is formed linearly, at a position that is to the inside of the first band-shaped key area within the display area, and the candidate display means displays the band-shaped candidate area, which is formed linearly, at a position that is to the inside of the second band-shaped key area within the display area.

With the first embodiment, after touching the first band-shaped key area displayed at the edge of the rectangular display area, the user can slide his finger toward the inside of the display area and thereby move the finger from the first band-shaped key area, through the second band-shaped key area, to the band-shaped candidate area.

In the second embodiment, the first key area display means displays the first band-shaped key area, which is formed in an arc shape, at a position that is a specific distance away from the edge of the touch screen within its display area. The second key area display means displays the second band-shaped key area, which is formed in an arc shape, at a position that is to the outside of the second band-shaped key area within the display area, and the candidate display means displays the band-shaped candidate area, which is formed in an arc shape, at a position to that to the outside of the second band-shaped key area within the display area.

With the second embodiment, after touching the arc-shaped first band-shaped key area displayed at a specific position on the touch screen, the user can slide his finger to the outside of this band-shaped key area (toward the edge of the touch screen) and thereby move the finger from the first band-shaped key area, through the second band-shaped key area, to the band-shaped candidate area.

Furthermore, the second embodiment can be implemented by using an entire circular or semicircular touch screen as the display area, or can be implemented by a method in which a circular or semicircular display area is set to part of a rectangular touch screen. In the latter case, the position of the display area may be suitably varied according to the type of application, user operation, and so forth.

The character input device of the third embodiment is further provided with an input character string display means for displaying on a touch screen confirmed character strings or character strings that are input candidates. This input character string display means displays the character displayed at the position of a touch point that has moved from the first band-shaped key area to the second band-shaped key area, as an input candidate at a specific position of the touch screen, while said touch point is within the second band-shaped key area, and displays the candidate character string displayed at the position of a touch point that has moved from the second band-shaped key area to the band-shaped candidate area, as an input candidate at a specific position of the touch screen, while said touch point is within the band-shaped candidate area. Furthermore, the input character string display means switches the display of the character string of the input candidate immediately prior to the disappearance of the touch point within the band-shaped candidate area, in response to this disappearance, to the display of the confirmed character string.

With the third embodiment, while the user is continuing a slide operation, the character or character string displayed at the position of the touch point is displayed as an input character on the touch screen, so accidental input is prevented and the efficiency of character input work can be further improved.

In the fourth embodiment, the candidate display means, in response to the movement of a touch point that had moved to the second band-shaped key area to the display position of one of the candidate character strings in the band-shaped candidate area, displays a second band-shaped candidate area, in which candidate character strings that can be inputted following the candidate character string displayed at that movement position are lined up, so as to match the direction of the first band-shaped candidate area displayed previously and so as to be adjacent to the first band-shaped candidate area on the opposite side from the second band-shaped key area. Also, the confirmation means confirms as the input character string a character string with a configuration following the candidate character string displayed at the disappearance position of the touch point in the second band-shaped candidate area after the candidate character string displayed at the position of the touch point when the second band-shaped candidate area within the first band-shaped candidate area is displayed, when the touch point that had moved to the first band-shaped candidate area further moves to the second band-shaped candidate area and then disappears at the display position of one of the candidate character strings within this second band-shaped candidate area.

With the fourth embodiment, when the user slides a finger from the first band-shaped key area, through the second band-shaped key area, to the band-shaped candidate area, a second band-shaped candidate area appears in which character strings of linked candidates for the candidate character string displayed at the position of that finger are lined up. The user selects a specific candidate character string in the first band-shaped candidate area first displayed by sliding his finger to that candidate character string, and when the user then lifts up his finger at the display position of one of the linked candidates by sliding the finger to the second band-shaped candidate area displayed in response to this selection, a character string with a configuration that links the character string of the linked candidate displayed at the last touch position in the second band-shaped candidate area to the candidate character string selected in the first band-shaped key area is confirmed as the input character string. This allows a plurality of candidate character strings to be selected all at once.

With the second character input device of the present invention, the candidate display means has a first candidate area display means for displaying at a specific position on the touch screen a first band-shaped candidate area in which candidate character strings that match the input character received by the input character reception means are lined up, and a second candidate area display means for displaying, in response to the detection of a touch point at the display position of one of the candidate character strings within the first band-shaped candidate area, a second band-shaped candidate area in which candidate character strings that can be inputted following the candidate character string displayed at that detection position are lined up, so as to match the orientation of the first band-shaped candidate area and so as to be adjacent to the first band-shaped candidate area in the width direction. Also, the confirmation means selects as the input character string a character string with a configuration following the candidate character string displayed at the disappearance position of the touch point in the second band-shaped candidate area after the candidate character string displayed at the position of the touch point within the first band-shaped candidate area when the second band-shaped candidate area is displayed, in response to the disappearance of the touch point at the display position of one of the candidate character strings in the area after the touch point detected in the first band-shaped candidate area has moved from the first band-shaped candidate area to the second band-shaped candidate area.

Again with the second character input device, when the user selects one of the candidate character strings in the first band-shaped candidate area by placing a finger on said candidate character string, a second band-shaped candidate area appears in which character strings of linked candidates for this candidate character string are lined up. After the user has selected the desired candidate character string in the first band-shaped candidate area by placing a finger on it, when that finger is lifted at the display position of one of the linked candidates by sliding the finger to the second band-shaped candidate area, a character string with a configuration following the candidate character string that was displayed at the position where the finger was lifted in the second band-shaped candidate area after the candidate character string selected in the first band-shaped candidate area is confirmed as the input character string. Since the band-shaped candidate areas are lined up the width direction and their orientations are aligned, the amount of operation required to move between the band-shaped candidate areas can be reduced. Thus, a plurality of candidate characters can be selected with a single slide operation, and this improves convenience.

The first and second character input devices of the present invention can be applied to a variety of information processing devices equipped with a touch screen.

With the present invention, the input of character strings, which had to be divided up into a number of operations in the past, can now be accomplished with a single slide operation, so the job of inputting characters is easier and convenience is greatly enhanced.

BRIEF DESCRIPTION OF DRAWINGS

FIG. 4 is a diagram illustrating an example of a screen in which the candidate area of linked candidates is provided in a plurality of stages.

FIG. 5 is another diagram illustrating an example of a screen in which the candidate area of linked candidates is provided in a plurality of stages.

DETAILED DESCRIPTION

Figure 1:
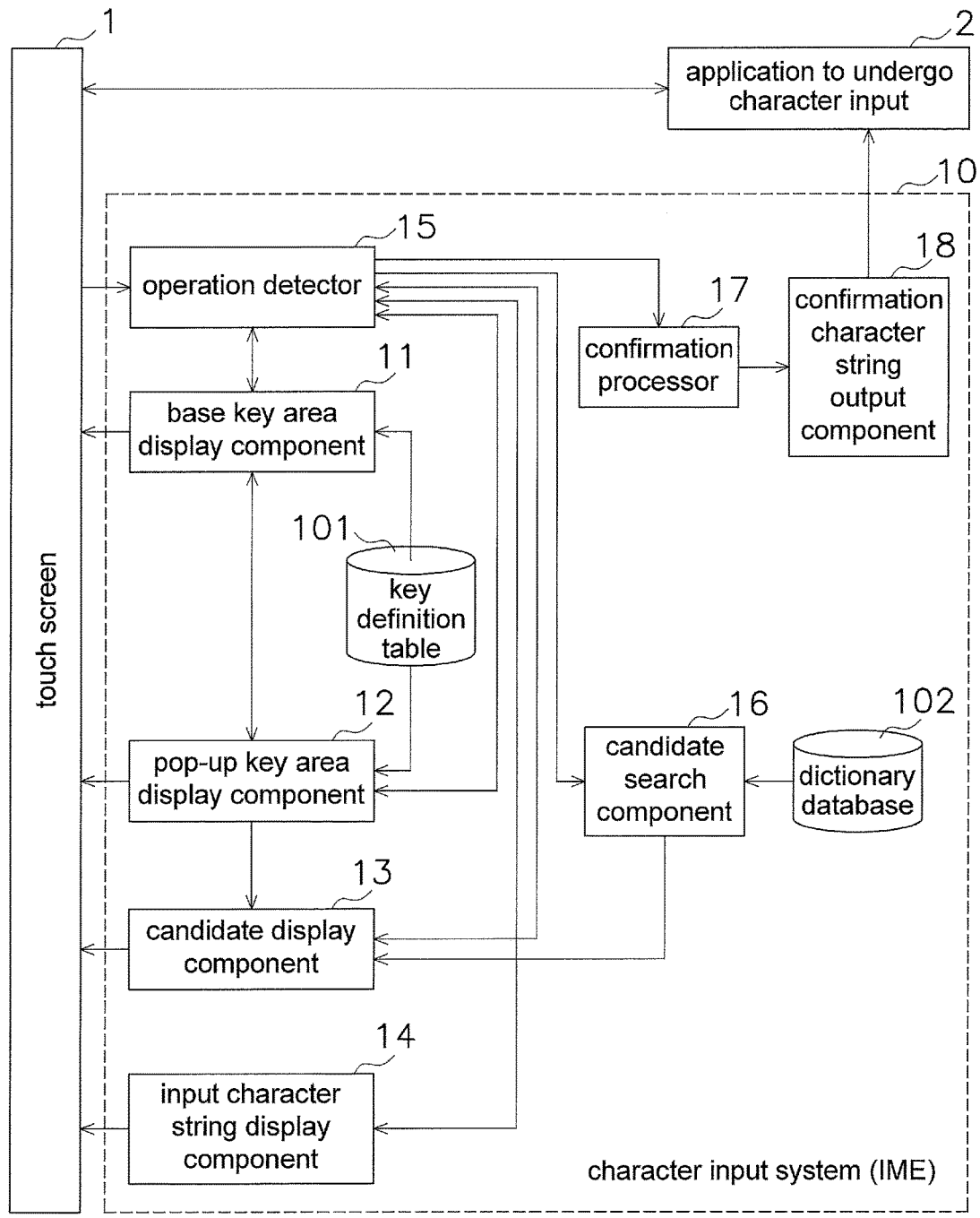
FIG. 1 is a function block diagram showing the configuration of a character input system to which the present invention is applied.

FIG. 1 shows the functions of a character input system (IME) to which the present invention is applied, along with the relation to a touch screen 1 provided on the front of an information processing device to which said system is applied, or to an application 2 that is to and ergo character input (such as an Internet browser, a mailer, or a notepad). The character input system 10 and the application 2 in this example are software incorporated into a portable information processing device such as a smart phone, a tablet terminal, or a wearable terminal, and operate under the control of an operation system (not shown).

The character input system 10 includes a base key area display component 11, a pop-up key area display component 12, a candidate display component 13, an input character string display component 14, an operation detector 15, a candidate search component 16, a confirmation processor 17, a confirmation character string output component 18, a key definition table 101, a dictionary database 102, and so forth.

Of the above components, the key definition table 101 and the dictionary database 102 are memory means in which information produced by the system developers is registered. A plurality of sets of dictionary data configured so that vocabulary or notation character strings indicating commonly used phrases are associated with the pronunciations of the characters, their priority, and so on are registered in the dictionary database 102.

Figure 2:
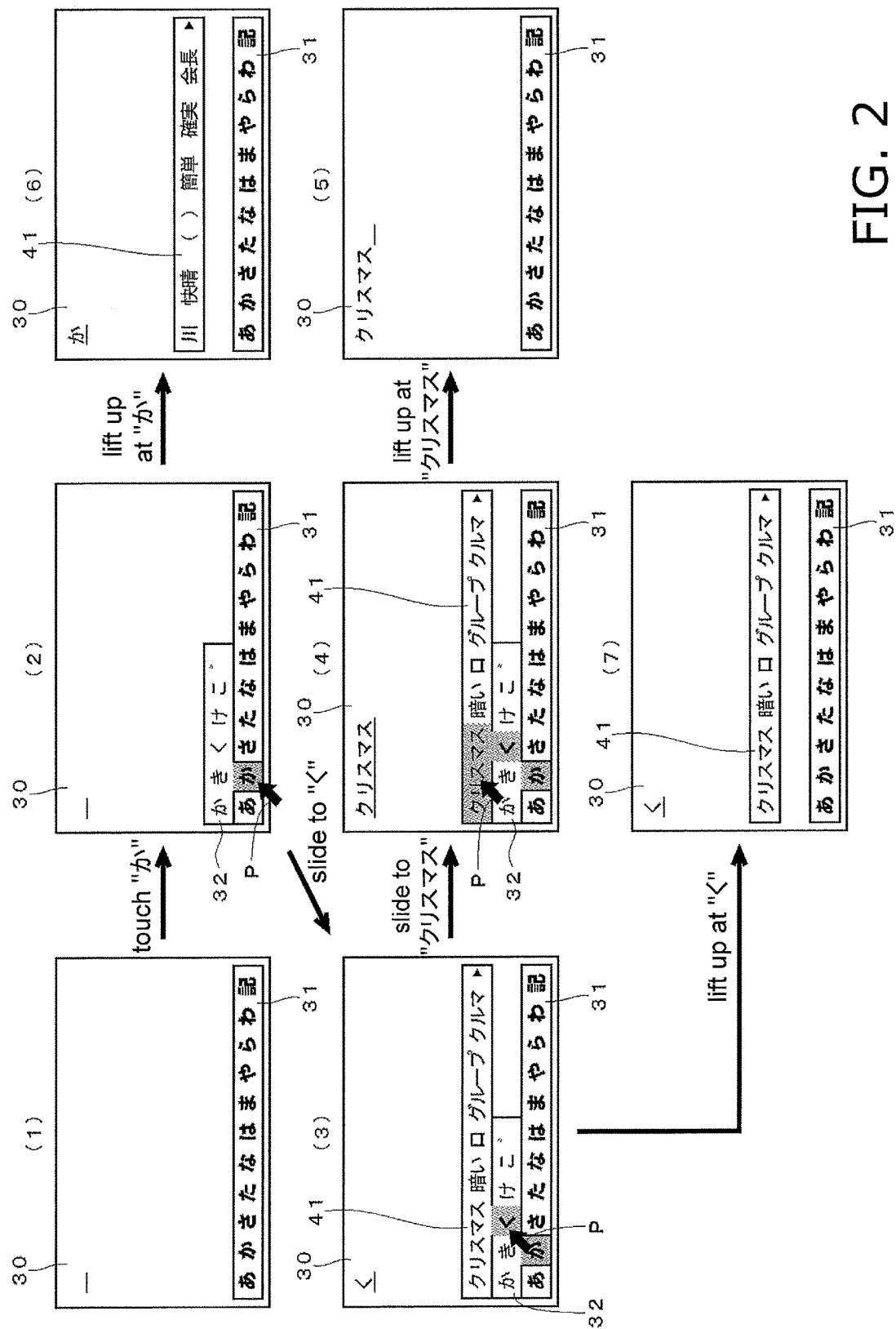
FIG. 2 is a diagram illustrating an example of the transition that accompanies operation of a character input screen.

Definition information related to the base key area 31 or the pop-up key area 32 shown in FIG. 2 onward is registered in the key definition table 101. As shown in FIG. 2, etc., the base key area 31 in this example is a band-shaped area (first band-shaped key area) in which representative characters (leading characters) of the various rows of the Japanese syllabary are lined up. The pop-up key area 32 is a band-shaped area (second band-shaped key area) in which characters including the representative character in one row are lined up, and is provided individually to each row. The arrangement of characters in these key areas 31 and 32 is registered in the key definition table 101. Furthermore, registration information for the corresponding pop-up key area 32 is tied to the characters in the registration information of the base key area 31.

The function of the various processors in FIG. 1 will now be described through reference to FIGS. 2 and 3. The base key area display component 11 and the pop-up key area display component 12 display the base key area 31 or the pop-up key area 32 on the touch screen 1 by referring to the above-mentioned key definition table 101. The candidate display component 13 displays a band-shaped candidate area 41 in which character strings of predicted candidates for a kana character string being inputted (hereinafter referred to as the "first candidate area 41"), or a band-shaped candidate area 42 in which character strings of linked candidates for predicted candidates are lined up (hereinafter referred to as the "second candidate area 42"). The candidate character strings displayed in these candidate areas 41 and 42 are extracted by the candidate search component 16 after searching the dictionary database 102.

The input character string display component 14 displays a character string corresponding to an operation in an character input area 30 in the touch screen 1, in a confirmed or unconfirmed state. The confirmation processor 17 decides on a character string displayed in a confirmed state, and the confirmation character string output component 18 outputs the confirmed character string to the application 2. The operation detector 15 inputs from the operation system the coordinates of a representative point within the area in which finger contact was detected within the touch screen 1, and detects various kinds of operation event pertaining to character input (hereinafter referred to as a "touch event") from a change in the inputted coordinates or a change in whether or not there is input. For example, a change from a state in which the coordinates of the touch point have not been inputted to a state in which they have been inputted indicates that a finger has been placed at the position indicated by the touch point (hereinafter referred to as a "touch"). Also, a change from a state in which the coordinates of the touch point have been inputted to a state in which they have not been inputted indicates that a finger has been lifted from the touch screen 1 at the position where the change occurred (where the touch point disappeared) (hereinafter referred to as a "lift-up"). Furthermore, when the coordinates of the touch point move while no lift-up has been detected after touch, this movement is detected as a slide operation.

The operation detector 15 acquires through the operation system the information displayed in the base key area 31, the pop-up key area 32, the first candidate area 41, and the second candidate area 42, along with position information for the display range. The coordinates of the touch point between a touch and a lift-up are compared to position information about various kinds of display information to determine which information display range of which area the touch point or the coordinates during lift-up are included in, the movement path of the touch point during a slide operation, etc. When the display components 11 to 14, the candidate search component 16, and the confirmation processor 17 operate on the basis of the determination result from the operation detector 15, the screen of the touch screen 1 changes in various ways, input character strings are confirmed as needed and outputted by the confirmation character string output component 18 to the application 2.

FIG. 2 shows an example of the transition of the display screen that occurs on the touch screen 1 as a result of the operation of the above-mentioned character input system 10. The arrow P in the drawing indicates the position of the touch point provided by the operation system (the same applies to subsequent drawings).

FIG. 2 (1) is the screen at the point when the character input processing has commenced. The base key area 31 made up of the representative characters is displayed at the lower end, and the blank portion 30 above serves as the character input area. As shown in FIG. 2 (2), when one of the characters in the base key area 31 is touched, the display range of the touched character ("か" in the depicted example) is distinguished from other locations by means of a different color or the like, and above this, adjacent to and in the same orientation as the base key area 31, is displayed the pop-up key area 32 in which are disposed the characters of the row whose representative character is the character that was touched.

FIG. 2 (3) shows the screen when a slide operation from the base key area 31 to the pop-up key area 32 has resulted in the touch point moving from the base key area 31 to the character "く" in the pop-up key area 32. With this screen, "く" is highlighted as the character displayed at the position of the touch point, and "く" is also displayed in the character input area 30. The "く" in the character input area 30 is underlined, which means that it has not yet been confirmed. This underlined character will hereinafter be called an "input candidate character," and a character string composed of a plurality of input candidate characters will be cal led an "input candidate character string."

Furthermore, the first candidate area 41, in which character strings that are predicted candidates for the above-mentioned input candidate character (words having pronunciations that start with "く") are lined up, is displayed above the pop-up key area 32 of the screen in FIG. 2 (3) so as to match the orientation of the pop-up key area 32 and be adjacent thereto.

FIG. 2 (4) shows the screen when another slide operation has resulted in the touch point included in the pop-up key area 32 on the screen in FIG. 2 (3) moving to the first candidate area 41. With this screen, the candidate character string displayed at the position of the touch point in the first candidate area 41 (in the depicted example, "クリスマス" [kurisumasu: Christmas]) is highlighted, and the display of the character input area 30 has changed from "く" to "クリスマス" While the touch point is detected within the first candidate area 41, the character string in the character input area 30 is underlined, which indicates that it is an input candidate character string. When a slide operation within the first candidate area 41 causes the touch point to move, the display of the input candidate character string also changes in response to this movement. For example, if the touch point moves from "クリスマス" to "暗い N" [kurai: dark], the input candidate character string in the character input area 30 also changes from "クリスマス" to "暗い."

FIG. 2 (5) shows the screen when a lift-up operation has been performed at the display position of "クリスマス" within the first candidate area 41 on the screen in FIG. 2 (4). This lift-up changes the "クリスマス" of the input candidate character string in the character input area 30 to a confirmed character string that is not underlined, after which a cursor showing the input position is set. In response to this confirmation, the pop-up key area 32 and the first candidate area 41 disappear from the screen, but the base key area 31 is still displayed.

As discussed above, with this working example, everything from the selection of a kana character to the selection of a predicted candidate can be completed, and the input character string confirmed, by performing a lift-up after sliding a finger placed in the base key area 31 from the pop-up key area 32 to the first candidate area 41. The key areas 31 and 32 and the first candidate area 41 are displayed in the same orientation and in order from bottom to top, so the user can easily select characters and candidate character strings by moving to the various areas by upward slide operations and performing slide operations to the left and right as needed. Also, since the representative characters are also included in the pop-up key area 32, even when a representative character is selected and character input is performed, the character strings to be inputted can be selected in the same work order as when another character is selected.

Although not depicted in FIG. 2, in this working example, a slide operation that goes back down (hereinafter referred to as a "return slide") can be performed at any time, as long as no lift-up has been performed. For example, as in FIG. 2 (4), the screen can be returned to the state in FIG. 2 (3) and a character other than "く" in the pop-up key area 32 can be selected by performing a return slide from the first candidate area 41 to the pop-up key area 32 in a state in which the input candidate character string made up of predicted candidates is being displayed. It is also possible to select a character other than "か" in the base key area 31 by returning to the screen in FIG. 2 (2) by means of a return slide to the base key area 31.

The place were lift-up is possible is not limited to inside the first candidate area 41, and lift-up can also be received in the base key area 31 or the pop-up key area 32. If lift-up occurs in the key area 31 or 32, as shown in FIGS. 2 (6) and (7), the character displayed at the position of the lift-up ("か" or "く" in the depicted examples) is displayed as the input candidate character string in the character input area 30. The pop-up key area 32 disappears from the screen at this point, but the base key area 31 is still displayed, and the first candidate area 41 is displayed in which character strings of predicted candidates for the input candidate character string are arranged.

The base key area 31 in this example includes not only the representative characters of the various rows from "あ" to "わ," but also the character "記." When this "記" is touched, a pop-up key area 32 including of various symbols is displayed, but because there are so many things that can be displayed, it is possible to expand to an area of a plurality of rows by an expansion operation when necessary. After this expansion, the selection of a symbol can be received by a tap operation. The diacritical mark "゛" is included in the pop-up key area 32 of the "か," "さ," and "た" rows, and the diacritical marks "゛" and "゜" are included in the pop-up key area 32 for the "は" row. When the touch point has moved to these symbols, characters with their attached diacritical marks (が, ぎ, ぐ, げ, ご, ば, び, ぶ, ぺ, ぼ, etc.) appear in the pop-up key area 32.

The first candidate area 41 and the second candidate area 42 (described next) are designed so that the user can scroll through candidate character strings according to slide operations to the left or right.

Figure 3:
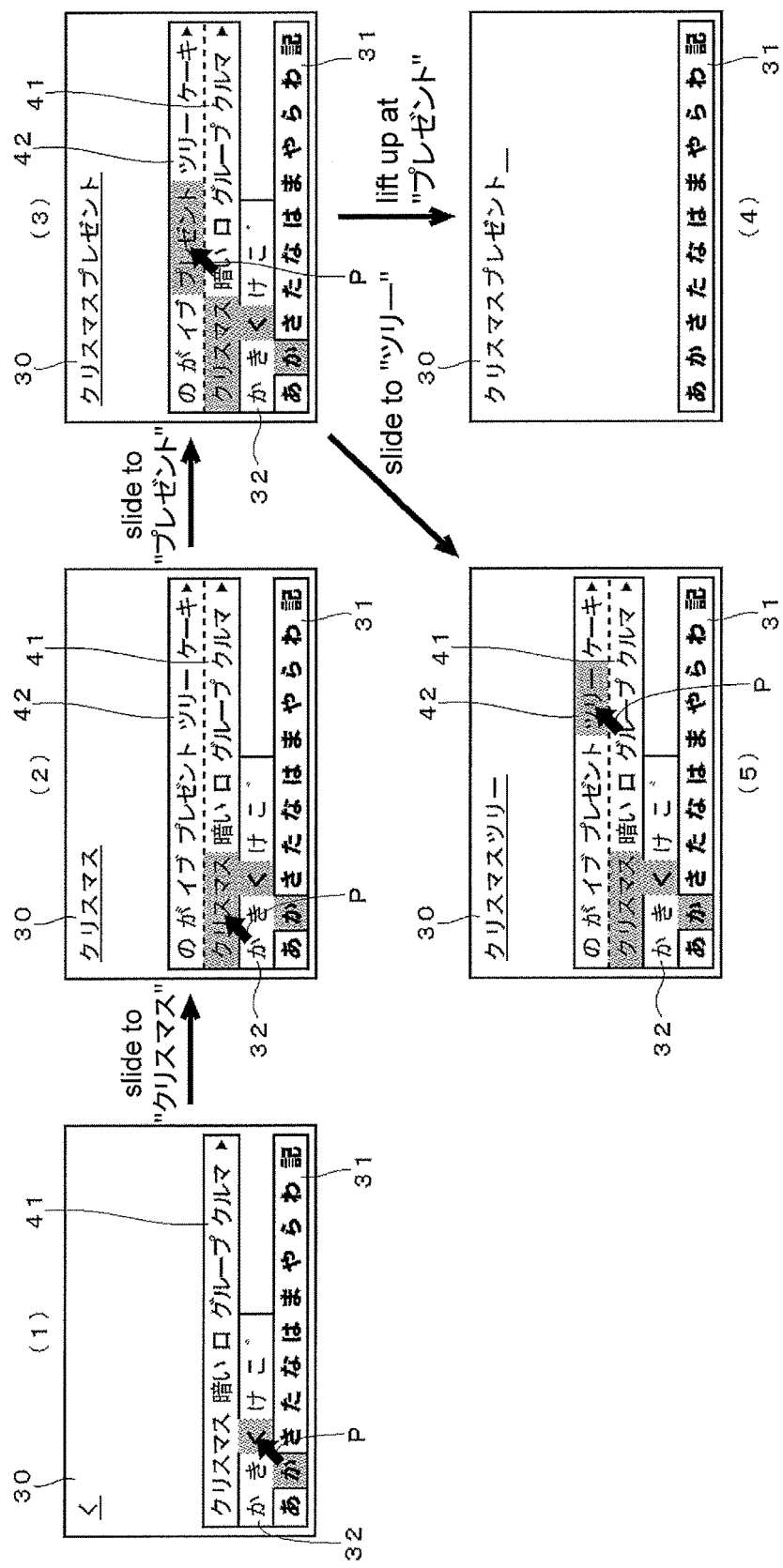
FIG. 3 is a diagram illustrating an example of the transition that accompanies operation of a character input screen.

FIG. 3 (1) is the same screen as in FIG. 2 (3), that is, a screen when "か" has been selected in the base key area 31, after which "く" is selected in the pop-up key area 32 displayed in response to the first selection. FIGS. 3 (2) to (5) show examples of the transition in the screen in response to a subsequent operation. In the example in FIG. 2, the first candidate area 41 in which the predicted candidates were disposed was the end position of the slide operation, but in the example in FIG. 3, the second candidate area 42, which shows linked candidates, is displayed in response to movement of the touch point to the first candidate area 41.

FIG. 3 (2) shows an example in which the second candidate area 42 in which character strings of linked candidates for the character string of the predicted candidate displayed at the touch point position (in the depicted example, "クリスマス") are lined up is displayed when the touch point has moved to the first candidate area 41. Just as in the example in FIG. 2 (4), "クリスマス," which is the selected predicted candidate character string, is displayed as the input candidate character string in the character input area 30 at this stage.

FIG. 3 (3) shows the screen when the touch point has further moved from the first candidate area 41 to a specific candidate character string (such as "プレゼント" [purezento: present]) in the second candidate area 42. The input candidate character string in the character input area 30 changes to the character string "クリスマスプレゼント" [Christmas present] with the configuration following "プレゼント" at the position of the touch point that has moved to the second candidate area 42 after "クリスマス," in the position of the touch point in the first candidate area 41 when the second candidate area was displayed. When a lift-up operation is performed in this state, as shown in FIG. 3 (4), the pop-up key area 32 and the candidate areas 41 and 42 disappear, and "クリスマスプレゼント" changes to a confirmed display.

As long as there has been no lift-up, the portion corresponding to the linked candidates of the input candidate character strings in the character input area 30 can be changed in response to movement of the touch point within the second candidate area 42. For example, if the touch point in the second candidate area 42 of the screen in FIG. 3 (3) moves from "プレゼント" to "ツリー" [tsurii; tree], the input candidate character string in the character input area 30 changes from "クリスマスプレゼント" [Christmas present] to "クリスマスツリー" [Christmas tree] as shown in FIG. 3 (5).

A return slide can also be performed from the second candidate area 42. For example, if the touch point in the second candidate area 42 on the screen in FIG. 3 (3) goes back into the first candidate area 41 as the result of a return slide, the input candidate character string is updated to the character string of the predicted candidate displayed at the position of the touch point in the first candidate area 41. The linked candidates for the updated input candidate character string are displayed in the second candidate area 42.

FIG. 4 shows the screen in a third example of the input character screen, in which two other candidate areas 43 and 44 are stacked over linked candidate character strings. In this working example, after the processing has proceeded by the same flow as in FIGS. 3 (1) and (2), the third candidate area 43 is displayed in response to movement of the touch point to the second candidate area 42, and a fourth candidate area 44 is displayed in response to movement of the touch point to the third candidate area 43. During this time, candidate character strings that had been displayed at the position of the touch point in the candidate areas 41 to 44 ("クリスマス," "プレゼント," "の," and "準備") are added in that order to the input candidate character string in the character input area 30. Thus, the user can put together an input of the character string "クリスマスプレゼントの準備" [Christmas present preparations], which used to be inputted by a four-stage operation.

FIG. 5 shows an example in which the key areas 31 and 32 and the candidate areas 41 to 44, which have the same content as in FIG. 4, are disposed so that their lengthwise direct ions are aligned in the up and down direction of the screen, with the base key area 31 at the left end and the other areas to the side of it. With both of the screens in FIGS. 4 and 5, the user can select characters or candidate character strings as needed by a slide operation in the lengthwise direction of the area being touched while moving the touch point to another area by a slide operation in the width direction of the area being touched. Thus, characters can be inputted more efficiently and with less operation involved.

However, in a situation in which there is not enough room in the display area, such as when the touch screen 1 has a compact size, it may be difficult to perform the displays in FI GS. 4 and 5. In such a situation, as shown in FIG. 6, the candidate areas 41 to 44 may be displayed superposed.

Figure 6:
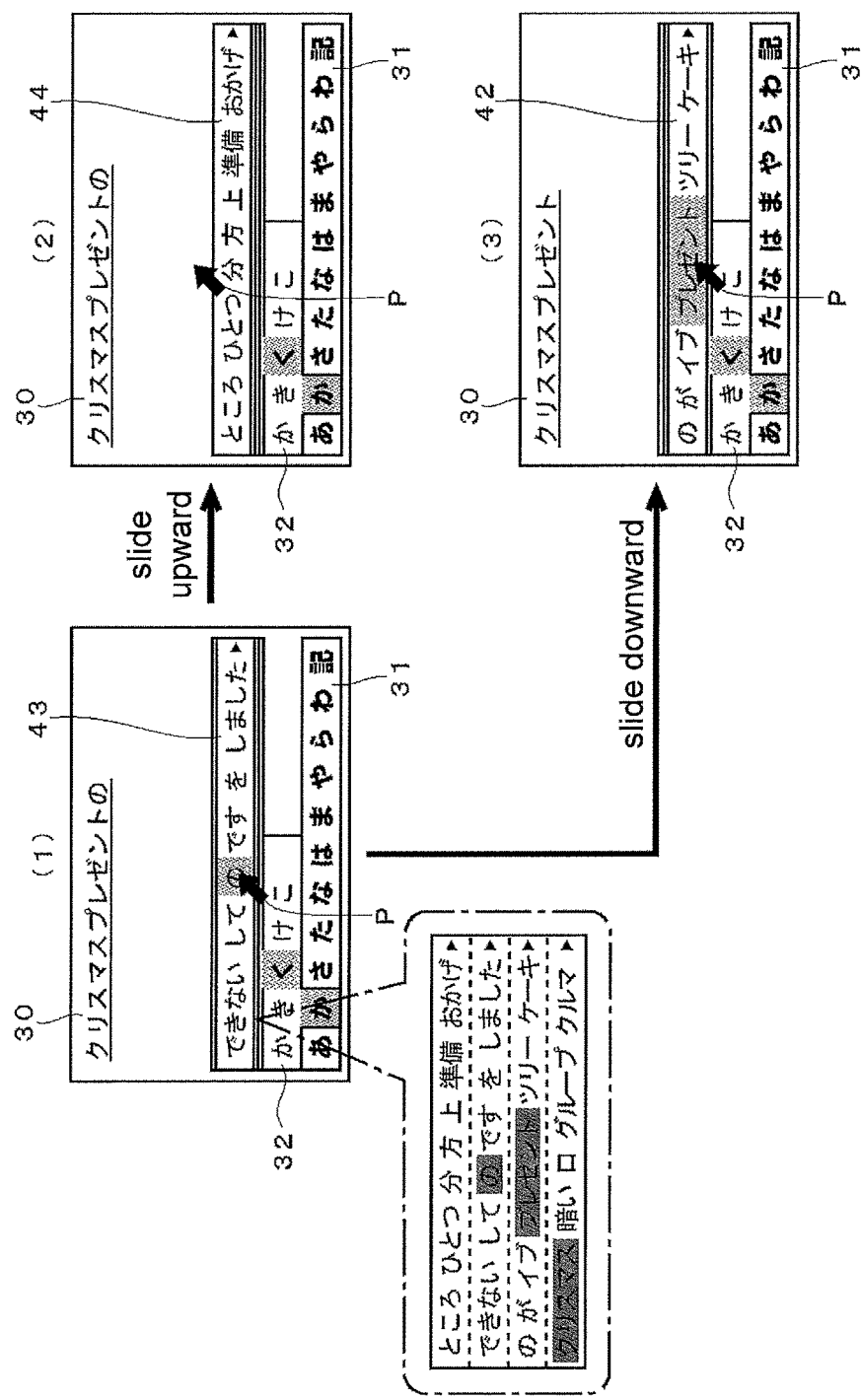
FIG. 6 is a diagram illustrating an example of the transition in the screen accompanying operation on a character input screen configured such that a plurality of candidate areas overlap.

With the screen in FIG. 6 (1), of the fourth candidate areas 41 to 44 shown in FIGS. 4 and 5, those up to the third candidate area 43 are displayed superposed, with their display positions offset slightly. The touch point is already in the third candidate area 43, and a fourth candidate area 44 is also produced that shows the linked candidates for the character ("の" in the depicted example) that is displayed at the position of this touch point. The fourth candidate area 44 in which the touch point is not moving is hidden, but if the touch point moves up somewhat from the third candidate area 43, the hidden fourth candidate area 44 is displayed as shown in FIG. 6 (2).

The display in the fourth candidate area 44 is maintained so long as the touch point does not move down from the lower edge of the fourth candidate area 44, even if the user changes the slide direction to downward. Thus, the user can slide his finger above the third candidate area 43 that is currently being displayed, thereby confirming that the candidate display has been switched to the fourth candidate area 44, and then switch the direction of the slide to downward and select a candidate character string in the fourth candidate area 44.

FIG. 6 (3) shows an example of the change in the screen when the touch point moves downward in the third candidate area 43, and is the opposite of the example in FIG. 6 (2). T his downward movement of the touch point is treated as a return slide to the second candidate area 42, so the fourth candidate area 44 disappears, and the third candidate area 43 goes to a state of not being touched, and is hidden. The position of the touch point automatically returns to the position at the point when the third candidate area 43 was produced (the display position of "プレゼント"), and the input candidate character string in the character input area 30 also returns to the "クリスマスプレゼント" that was being displayed before the touch point went into the third candidate area 43.

Figure 7:
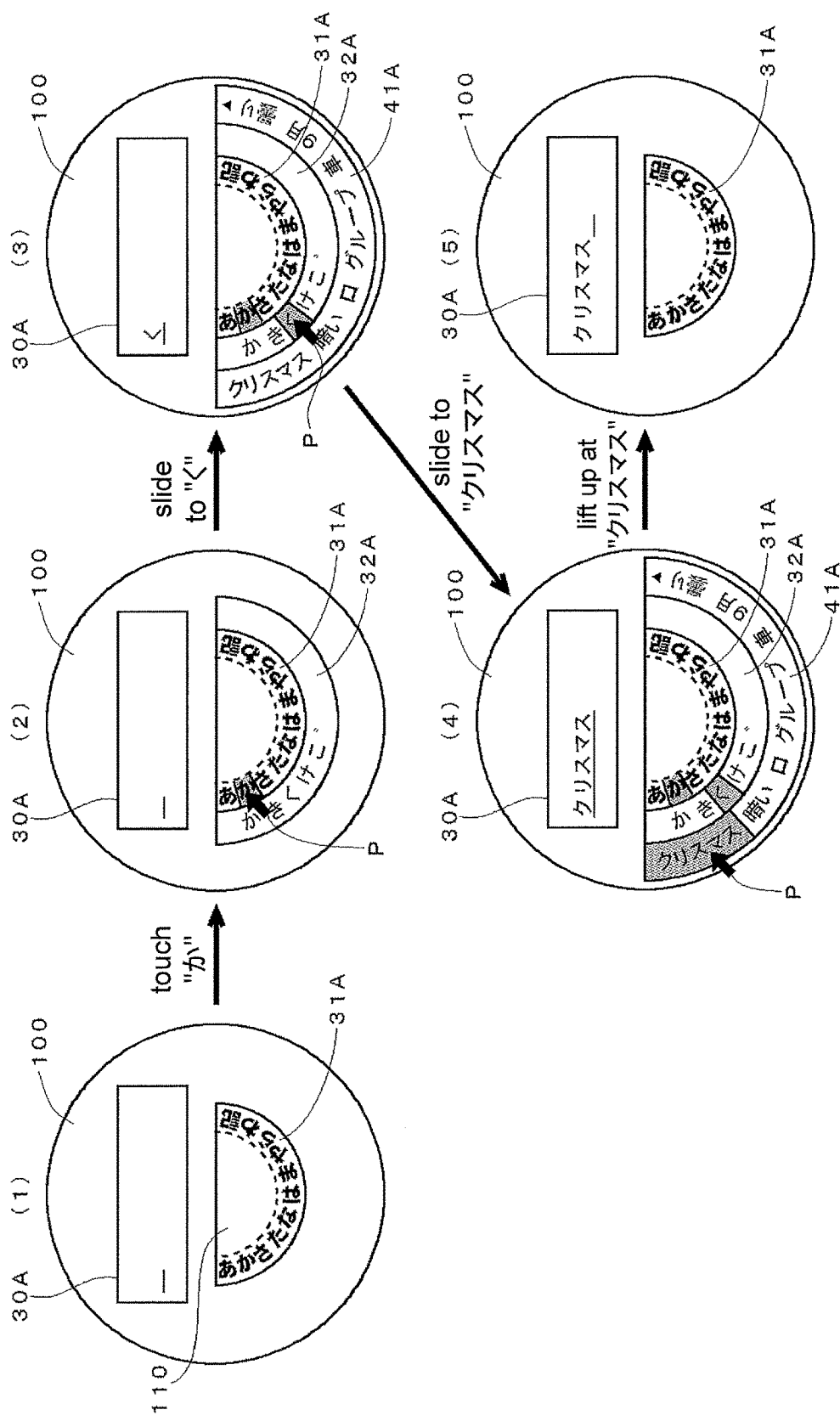
FIG. 7 is a diagram illustrating an example in which the same display as in FIG. 2 is performed in a circular display area.

FIG. 7 shows an example of performing display in the circular display area by the same method as that in the working example depicted in FIG. 2. This display area 100 can be set to be the total area of a circular touch screen 1, or it can be set to just a portion of the touchscreen 1, regardless of its shape.

A rectangular character input area 30A and a semicircular area 110 are disposed one above the other in the initial display area 100 shown in FIG. 7 (1). Representative characters a re lined up around an arc in the interior of the semicircular area 110. An arc-shaped area 31A in which this string of representative characters is displayed (the range from the imaginary arc indicated by a dotted line in the drawing to the arc that forms the outer edge of the area) functions as a base key area.

When a character inside the arc-shaped area 31A is tapped, as shown in FIG. 7 (2), an arc-shaped pop-up key area 32A, in which the characters of the row whose representative character is the character that was tapped are lined up, is displayed along the outside of the arc-shaped area 31A. Furthermore, when the touch point moves from the arc-shaped area 31A to the pop-up key area 32A in response to a slide operation, as shown in FIG. 7 (3), an arc-shaped first candidate area 41A, in which predicted candidates for the character "く" displayed at the position of the touch point are lined up, is displayed along the outside of the pop-up key area 32A.

Just as in the example in FIG. 2, with the character input area 30A, when the touch point is located in the pop-up key area 32A, the kana character displayed at the position of the touch point is displayed as an input candidate character (FIG. 7 (3)), and when the touch point moves to the first candidate area 41A, an input candidate character string including the predicted candidate displayed at that movement position is displayed (FIG. 7 (4)). Thereafter, until lift-up is detected, the display of the input candidate character string can be various changed in response to movement of the touch point.

FIG. 7 (5) is an example of the display after lift-up has been detected at the display position of "クリスマス" in the first candidate area 41A within the display area 100 shown in FIG. 7 (4). Here again, just as in the example in FIG. 2 (5), the input candidate character string in the character input area 30 is changed to a confirmed display state, and the pop-up key area 32A and the first candidate area 41A disappear from the screen.

Again in the working example in FIG. 7, if the display area 100 can be made somewhat larger, an arc-shaped second candidate area that shows linked candidates can be displayed along the outer edge of the first candidate area 41A in response to movement of the touch point to the first candidate area 41A. If necessary, third and fourth candidate areas can also be displayed, and the same display method as in the example in FIG. 6 can be employed.

Figure 8:
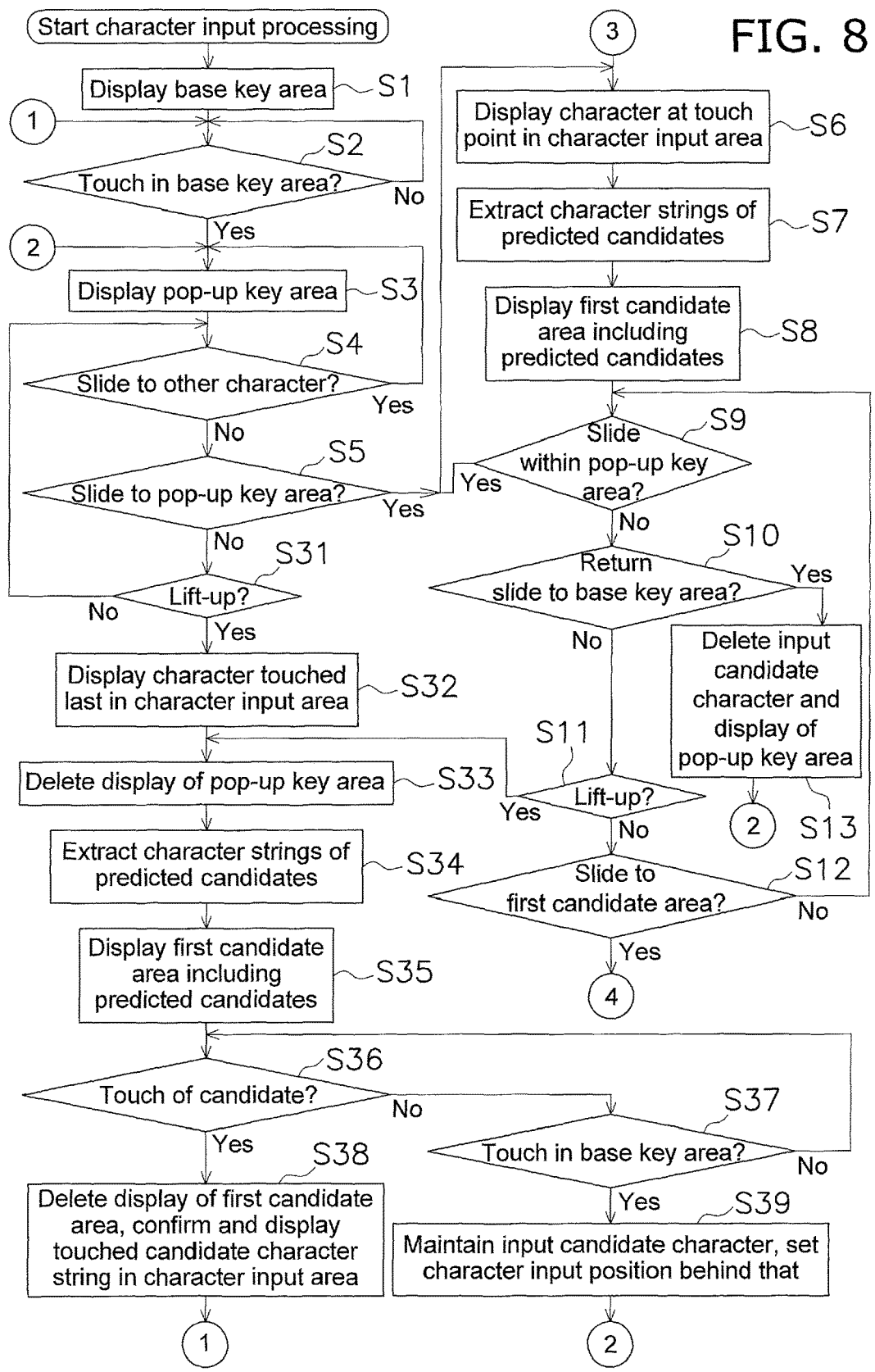
FIG. 8 is a flowchart of the flow of character input processing.
Figure 9:
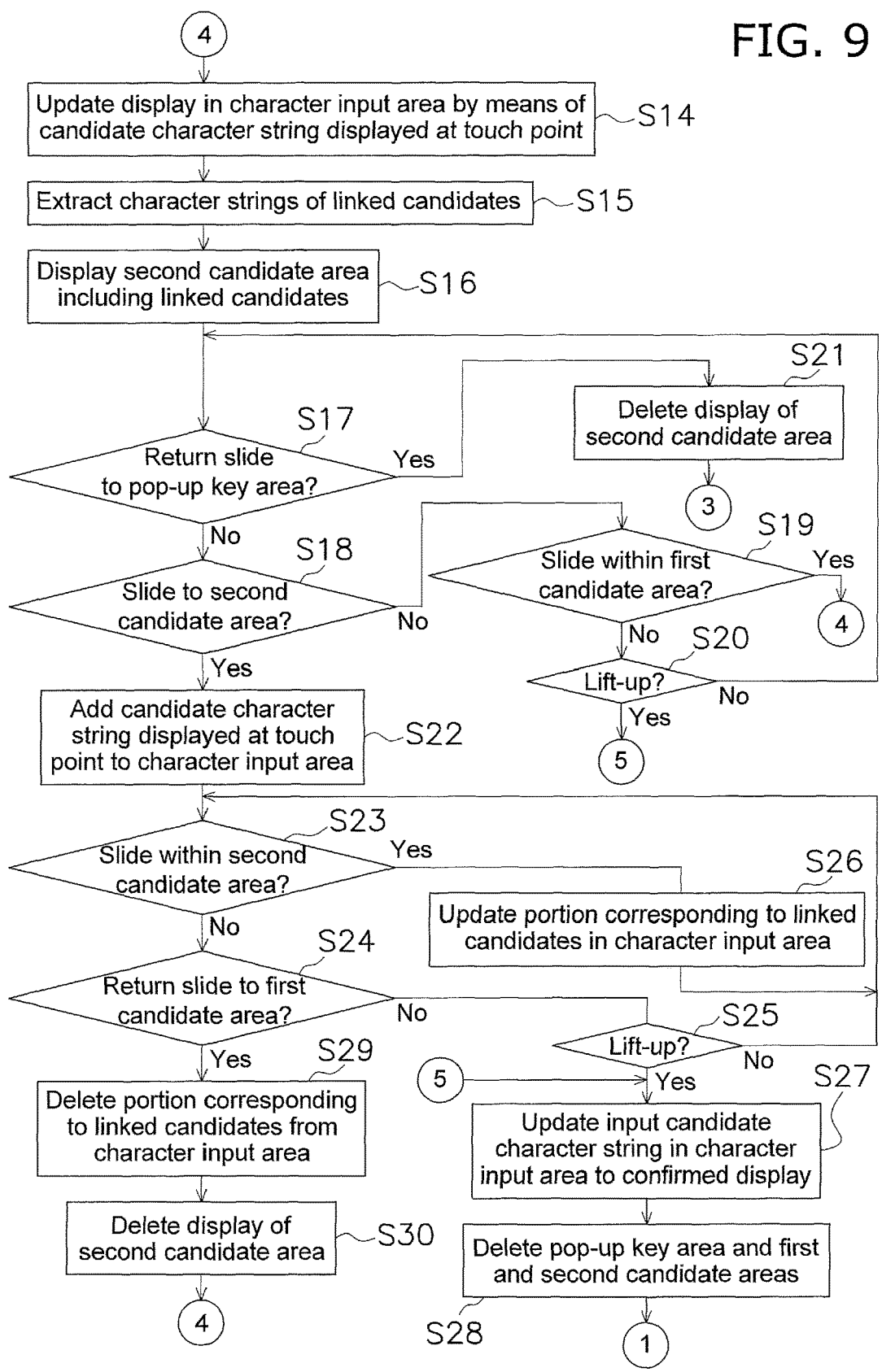
FIG. 9 is a flowchart of the flow of processing continuing from FIG. 8.

FIGS. 8 and 9 show the flow of the main processing performed by the character input system 10 shown in FIG. 1, for specifications that allow the display of four types of area, from the base key area 31 to the second candidate area 42. The processing procedure described below will focus on a scenario of high importance, while referring to the screens in FIGS. 2 and 3 as needed.

The character input processing in the drawings is begun in response to a tap of a character input column or the like of the application 2. First, the base key area 31 is displayed on the screen by the base key area display component 11 (step S1), and the initial screen shown in FIG. 2 (1) appears as a result. When a touch to the base key area 31 is detected by the operation detector 15 ("Yes" in step S2), the pop-up key area 32 corresponding to the character displayed at the position of the touch point is displayed by the pop-up key area display component 12 (step S3), and the screen changes to that in FIG. 2 (2). Step S3 includes processing to highlight a specific character in the base key area 31 or the pop-up key area 32 on the basis of the coordinates of the touch point.

The operation detector 15 determines whether or not there is a touch event, such as a slide within the base key area 31, a slide to the pop-up key area 32, or a lift-up, on the basis of movement of the touch point on the above-mentioned screen (steps S4, S5, and S31).

We will now describe the flow of processing executed in a scenario in which the screen transitions in the order of (1)→(2)→(3)→(4) in FIG. 3. First, if the operation detector 15 detects a slide to the pop-up key area 32, step S4 becomes "No" and step S5 becomes "Yes," and the flow proceeds to step S6. In step S6, the character displayed at the position of the touch point is displayed by the input character string display component 14 at the position of the cursor of the character input area 30 as an input candidate character. The candidate search component 16 then searches the dictionary database 102 using the input candidate character string, extracts character strings of predicted candidates (step S7), and the candidate display component 13 receives this extraction result and displays it in the first candidate area 41 (step S8). As a result of these steps S6, S7, and S8, a screen with the configuration shown in FIG. 3 (1) is displayed.

If a slide to the first candidate area 41 is detected in the determination processing of the operation detector 15 on the above-mentioned screen (steps S9 to S12), steps S9, S10, and S11 become "No," step S12 becomes "Yes," and the flow proceeds to step S14 in FIG. 9.

In step S14, the input character string display component 14 acquires the character string of a predicted candidate displayed at the position of the touch point in the first candidate area 41, and the display in the character input area 30 is updated using this candidate character string as the input candidate character string. Then, the candidate search component 16 searches the dictionary database 102 using the above-mentioned input candidate character string, extracts character strings for linked candidates (step S15), and the candidate display component 13 receives this extraction result and displays the second candidate area 42 (step S16). As a result of these steps S14, S15, and S16, a screen with the configuration shown in FIG. 3 (2) is displayed.

When a slide to the second candidate area 42 is detected in the in the determination processing of the operation detector 15 on the above-mentioned screen (steps S17 to S20), step S17 becomes "No," step S18 becomes "Yes," and the flow proceeds to step S22. In step S22, the input character string display component 14 acquires the character string of a linked candidate displayed at the position of the touch point in the second candidate area 42, and this character string is added after the input candidate character string in the character input area 30. As a result of this processing, a screen with the configuration shown in FIG. 3 (3) is displayed.

If lift-up from the second candidate area 42 is detected in the determination processing of the operation detector 15 on the above-mentioned screen (steps S23 to S25), steps S23 and S24 become "No," step S25 becomes "Yes," and the flow proceeds to step S27. In step S27, the input character string display component 14 confirms as the input character string the input candidate character string displayed in the character input area 30, and updates the display to a confirmed character string that is not underlined. Then, in step S28, the display of the pop-up key area 32 and the first and second candidate areas 41 and 42 is deleted by the pop-up key area display component 12 and the candidate display component 13. This processing updates the screen to the configuration shown in FIG. 3 (4), and the flow returns to step S2.

If there is a change in the linked candidates corresponding to the touch point as a result of a slide in the second candidate area 42 from the time when a slide to the second candidate area 42 is detected until a lift-up is detected, step S23 becomes "Yes" and the flow proceeds to step S26. In step S26, the input character string display component 14 rewrites the portion corresponding to the character string of linked candidates out of the input candidate character string in the character input area 30 so that it coincides with the character string of linked candidates displayed at the position of the moved touch point.

If lift-up is detected in the first candidate area 41 rather than in the second candidate area 42, step S20 becomes "Yes," and steps S27 and S28 are executed. This updates the screen to the configuration shown in FIG. 2 (5), and the flow returns to step S2.

If a return slide from the second candidate area 42 to the first candidate area 41 is detected, step S24 becomes "Yes," the flow proceeds to step S29, and the input character string display component 14 deletes the portion corresponding to the linked candidates from the input candidate character string in the character input area 30. In the following step S30, the candidate display component 13 deletes the display of the second candidate area 42. After this, steps S14, S15, and S16 are executed, and as a result the character string of predicted candidates displayed at the position of the touch point that had gone into the first candidate area 41 as a result of the return slide becomes the input candidate character string, and the second candidate area 42 showing the linked candidates for this input candidate character string is displayed.

If no slide to the second candidate area 42 is performed in the first candidate area 41, and a return slide to the pop-up key area 32 is detected, step S17 becomes "Yes," the flow proceeds to step S21, and the display of the second candidate area 42 is deleted by the candidate display component 13. After this, the flow returns to step S6, and the character input area 30 is updated to a state in which the character displayed at the position of the touch point that h ad gone into the pop-up key area 32 as a result of a return slide is displayed as the input candidate character. Furthermore, steps S7 and S8 update the first candidate area 41 to content according to the updated input candidate character.

If a return slide from the pop-up key area 32 to the base key area 31 is detected, step S10 in FIG. 8 becomes "Yes," the flow proceeds to step S13, and the input candidate character displayed as a result of the detection of a slide to the pop-up key area 32 is deleted. The pop-up key area 32 is also temporarily deleted at this point, but thereafter the flow returns to step S3, and the pop-up key area 32 is displayed again on the basis of the touch point after the return slide.

Also, if a slide is detected within the base key area 31, the pop-up key area 32, or the first candidate area 41 ("Yes" in any of steps S4, S9, or S19), the display can be updated according to the position of the moved touch point in each case.

After the pop-up key area 32 has been displayed in response to a touch in the base key area 31 as a result of steps S1 to S3, if no slide to the pop-up key area 32 is detected and a lift-up in the base key area 31 is detected, steps S4 and S5 become "No," step S31 becomes "Yes," and the flow proceeds to step S32.

In step S32, the input character string display component 14 acquires the character corresponding to the last touch point in the base key area 31, and displays this character as an input candidate character in the character input area 30.

The pop-up key area display component 12 receives this and deletes the display of the pop-up key area 32 (step S33), the candidate search component 16 searches the dictionary database 102 and extracts character strings for predicted candidates for the input candidate character (step S34), and the candidate display component 13 displays the first candidate area 41 including the predicted candidates (step S35). These steps S32 to S35 change the screen to the configuration shown in FIG. 2 (6).

Steps S6 to S8 are executed in response to a slide from the base key area 31 to the pop-up key area 32, and if a lift-up is detected in the pop-up key area 32 after a screen with the configuration shown in FIG. 2 (3) or FIG. 3 (1) is displayed, steps S9 and S10 become "No," step S11 becomes "Yes," and steps S33, S34, and S35 are executed. This processing changes the screen to the configuration shown in FIG. 2 (7).

For a screen with the configuration shown in FIG. 2 (6) or FIG. 2 (7), if a touch is detected for a specific candidate character string within the first candidate area 41, step S36 becomes "Yes," and the flow proceeds to step S38. In step S38, the input candidate character in the character input area 30 is deleted by the input character string display component 14, and in its place the candidate character string selected by the touch is confirmed and displayed. The display of the first candidate area 41 by the candidate display component 13 is also deleted, and the flow returns to step S2.

For a screen with the configuration in FIG. 2 (6) or FIG. 2 (7), it is also possible that the base key area 31 will be touched, rather than the first candidate area 41. In this case, step S36 becomes "No," step S37 becomes "Yes," and the flow proceeds to step S39. In step S39, the input character string display component 14 maintains the input candidate character that is currently being displayed in the character input area 30, and puts the cursor behind this. After this, the flow returns to step S3, and the pop-up key area display component 12 displays the pop-up key area 32 corresponding to the character at the touch point.

If a slide to the pop-up key area 32 displayed in step S2 after step S39 is detected ("Yes" in step S5), then steps S6, S7, and S8 are executed in that order, just as described above. These steps result in the display of an input candidate character string with a configuration in which kana characters are provided in response to a new touch event to the kana characters from before, and in the display of the first candidate area 41 showing predicted candidates for this input candidate character string. Furthermore, if there is a slide to this first candidate display area, the second candidate area 42 is displayed that shows linked candidates for the candidate character string displayed at the position of the touch point that had gone into the first candidate display area. Thereafter, processing can proceed by the same flow as that described previously.

In the above procedure, if an input character string is confirmed by lift-up in the candidate area 41 or 42, the candidate area 41 or 42 is deleted, resulting in a state in which touch is again received from the base key area 31 (FIG. 2 (5) and FIG. 3 (4)), but at this point the second candidate area 42 may be displayed that shows linked candidates for the confirmed input character string. If the display of the second candidate area 42 is continued even after the confirmation of the input character string, then a candidate character string subsequently touched can be confirmed as the input character string in response to the touch of a linked candidate, and the second candidate area 42 showing the next linked candidate can be displayed. If the base key area 31 is touched without a linked candidate being touched, then the display of the second candidate area 42 is deleted, and the result is a state in which character input is again possible by slide operation from the base key area 31.

For a screen after a lift-up from the base key area 31 or the pop-up key area 32 (FIG. 2 (6) or (7)), the second candidate area 42 showing linked candidates for the candidate character string displayed at the position of the touch point may be displayed above the first candidate area 41 in response to a touch of the first candidate area 41 within the screen. Here again, a character string with a configuration that follows the character string of linked candidates displayed at the position of the touch point after the character string of predicted candidates selected in the first candidate area 41 can be confirmed by performing lift-up after a slide from the first candidate area 41 to the second candidate area 42.

As shown in FIGS. 4 and 5, if a candidate area showing linked candidates is displayed over a plurality of stages, the same procedure as in steps S14, S15, and S16 should be executed in response to the detection of a slide to each of the candidate areas except for the last one. A return slide in these candidate areas, or a slide or lift-up in these candidate areas, can be dealt with by processing in accordance with the flow described above.

All of the various working examples given above were premised on the fact that character input operations were received in the band-shaped base key area 31 (31A) and the pop-up key area 32 (32A), but this is not the only option. Even if a key area of some other form is used, the first candidate area 41 and the second candidate area 42 can still be used for display and selection of candidate character strings. Here again, some kind of input candidate character is displayed by means of a tap operation, a slide operation, etc., in a key area, and the band-shaped first candidate area 41 showing predicted candidates for an input candidate character is displayed in response to this. Lift-up is sometimes performed first at this stage, but here again, the band-shaped second candidate area 42 showing linked candidates for the candidate character string displayed at the position of the touch point at that time can be displayed in response to the first candidate area 41 being touched.

Thus, after the user touches the desired candidate character string within the first candidate area 41, he can slide his finger to the second candidate area 42 displayed as a result of that touch, and lift up at the display position of the desired candidate character string, thereby confirming a character string with a configuration that follows the candidate character string displayed at the position of the touch point in the second candidate area 42 after the candidate character string selected in the first candidate area 41.

Here again, just as in the examples in FIGS. 4, 5, and 6, the candidate areas of a plurality of stages of linked candidates can be displayed in order in response to a slide operation, and a character string that links the candidate character strings selected in the various candidate areas into a single string can be confirmed in response to the last lift-up.

The character input system 10 described above is not limited to a smart phone, and can also be introduced into the controller of various kinds of compact information processing device having a touch screen, such as a PDA, a remote control, or a wristwatch style portable terminal device. Also, it can be applied to devices of various forms that are equipped with a touch screen, such as a facsimile device, a television set, or a household electrical appliance.

INDUSTRIAL APPLICABILITY

With the present invention, the input of character strings by operations that had to be broken up into a plurality of operations in the past can be carried out by a single slide operation, so character input work is easier and convenience is greatly improved.

REFERENCE SIGNS LIST 1 touch screen
2 application
10 character input system
11 base key area display component
12 pop-up key area display component
13 candidate display component
14 input character string display component
15 operation detector
16 candidate search component
17 confirmation processor
30, 30A input character area
31, 31A base key area (first band-shaped key area)
32, 32A pop-up key area (second band-shaped key area)
41, 41A first band-shaped candidate area
42 second band-shaped candidate area
100 circular display area

The invention claimed is:

1. A non-transitory, computer readable medium, having stored thereon a program, the program including instructions for a character input system, the instructions for causing a computer connected to a touch screen to function as a character input device, the character input device comprising:
   an input character reception component for displaying on the touch screen a key area in which a plurality of characters are arranged, and receiving as an input character a character that complies with a detection status of a touch point for the key area;
   a candidate display component for displaying on the touch screen a candidate area that includes candidate character strings that match the input character received by the input character reception component; and
   a confirmation component for confirming as an input character string a specific candidate character string that complies with a detection status of a touch point for the candidate area,
   wherein the input character reception component has a first key area display component for displaying at a specific position on the touch screen a first band-shaped key area in which representative characters of a plurality of character groups in which the representative characters are given one by one are lined up, and a second key area display component for displaying, in response to a detection of a touch point at a display position of one of the characters within the first band-shaped key area, a second band-shaped key area in which characters including representative characters in character groups in which the representative characters are the characters displayed at this detection position are lined up, so that the second band-shaped key area is adjacent to the first band-shaped key area in a width direction and matches an orientation of the first band-shaped key area,
   the candidate display component, in response to a movement of a touch point detected in the first band-shaped key area to a display position of one of the characters in the second band-shaped key area, displays a band-shaped candidate area in which candidate character strings that match the character displayed at that movement position are lined up, so that the band-shaped candidate area matches an orientation of the second band-shaped key area and is adjacent to the second band-shaped key area on the opposite side from the first band-shaped key area, and
   the confirmation component, in response to a disappearance of the touch point that moves to the second band-shaped key area at the display position of one of the candidate character strings after moving to the band-shaped candidate area, confirms as the input character string the candidate character string displayed at the disappearance position.

2. The non-transitory computer readable medium according to claim 1, wherein the first key area display component displays the first band-shaped key area, which is formed linearly, to conform to one edge of the touch screen within a rectangular display area of the touch screen, and
   the second key area display component displays the second band-shaped key area, which is formed linearly, at a position that is to the inside of the first band-shaped key area within the display area, and the candidate display component displays the band-shaped candidate area, which is formed linearly, at a position that is to the inside of the second band-shaped key area within the display area.

3. The non-transitory computer readable medium according to claim 1, wherein the first key area display component displays the first band-shaped key area, which is formed in an arc shape, at a position that is a specific distance away from the edge of the touch screen within the display area of the touch screen, and
   the second key area display component displays the second band-shaped key area, which is formed in an arc shape, at a position that is to the outside of the second band-shaped key area within the display area, and the candidate display component displays the band-shaped candidate area, which is formed in an arc shape, at a position to that to the outside of the second band-shaped key area within the display area.

4. The non-transitory computer readable medium according to claim 1, wherein the character input device further comprises an input character string display component for displaying the character displayed at the position of a touch point that moves from the first band-shaped key area to the second band-shaped key area, as an input candidate at a specific position of the touch screen, while the touch point is within the second band-shaped key area, displaying the candidate character string displayed at a touch point that moves from the second band-shaped key area to the band-shaped candidate area, as an input candidate at a specific position of the touch screen, while the touch point is within the band-shaped candidate area, and switching the display of the character string of the input candidate immediately prior to the disappearance of the touch point within the band-shaped candidate area, in response to the disappearance, to a confirmed character string.

5. The non-transitory computer readable medium according to claim 1, wherein the candidate display component, in response to the movement of a touch point that moves to the second band-shaped key area to the display position of one of the candidate character strings in the band-shaped candidate area, displays a second band-shaped candidate area, in which candidate character strings that are allowed to be inputted following the candidate character string displayed at the movement position are lined up, so as to match a direction of the first band-shaped candidate area displayed previously and so as to be adjacent to the first band-shaped candidate area on the opposite side from the second band-shaped candidate area, and the confirmation component confirms as the input character string a character string with a configuration following the candidate character string displayed at the disappearance position of the touch point in the second band-shaped candidate area after the candidate character string displayed at the position of the touch point within the first band-shaped candidate area when the second band-shaped candidate area is displayed, when the touch point that moves to the first band-shaped candidate area further moves to the second band-shaped candidate area and then disappears at the display position of one of the candidate character strings within the second band-shaped candidate area.

6. A non-transitory computer readable medium, having stored thereon a program, the program including instructions for a character input system, the instructions for causing a computer connected to a touch screen to function as a character input device, the character input device comprising:

an input character reception component for displaying on the touch screen a key area in which a plurality of characters are arranged, and receiving as an input character a character that complies with a detection status of a touch point for the key area;

a candidate display component for displaying on the touch screen a candidate area that includes candidate character strings that match the input character received by the input character reception component; and a confirmation component for confirming as an input character string a specific candidate character string that complies with a detection status of a touch point for the candidate area, wherein the candidate display component has a first candidate area display component for displaying at a specific position on the touch screen a first band-shaped candidate area in which candidate character strings that match the input character received by the input character reception component are lined up, and a second candidate area display component for displaying, in response to a detection of a touch point at a display position of one of the candidate character strings within the first band-shaped candidate area, a second band-shaped candidate area in which candidate character strings that are allowed to be inputted following the candidate character string displayed at that detection position are lined up, so as to match an orientation of the first band-shaped candidate area and so as to be adjacent to the first band-shaped candidate area in a width direction, and the confirmation component selects as the input character string a character string with a configuration following the candidate character string displayed at a disappearance position of the touch point in the second band-shaped candidate area after the candidate character string displayed at the position of the touch point within the first band-shaped candidate area when the second band-shaped candidate area is displayed, in response to the disappearance of the touch point at the display position of one of the candidate character strings within the area after the touch point detected in the first band-shaped candidate area moves from the first band-shaped candidate area to the second band-shaped candidate area.

7. A character input device connected to a touch screen, the character input device comprising:

an input character reception component for displaying on the touch screen a key area in which a plurality of characters are arranged, and receiving as an input character a character that complies with a detection status of a touch point for the key area;

a candidate display component for displaying on the touch screen a candidate area that includes candidate character strings that match the input character received by the input character reception component; and a confirmation component for confirming as an input character string a specific candidate character string that complies with a detection status of a touch point for the candidate area, wherein the input character reception component has a first key area display component for displaying at a specific position on the touch screen a first band-shaped key area in which representative characters of a plurality of character groups in which the representative characters are given one by one are lined up, and a second key area display component for displaying, in response to a detection of a touch point at a display position of one of the characters within the first band-shaped key area, a second band-shaped key area in which characters including representative characters in character groups in which the representative characters are the characters displayed at the detection position are lined up, so that the second band-shaped key area is adjacent to the first band-shaped key area in a width direction and matches an orientation of the first band-shaped key area, the candidate display component, in response to a movement of a touch point detected in the first band-shaped key area to a display position of one of the characters in the second band-shaped key area, displays a band-shaped candidate area in which candidate character strings that match the character displayed at that movement position are lined up, so that the band-shaped candidate area matches an orientation of the second band-shaped key area and is adjacent to the second band-shaped key area on the opposite side from the first band-shaped key area, and the confirmation component, in response to a disappearance of the touch point that moves to the second band-shaped key area at the display position of one of the candidate character strings after moving to the band-shaped candidate area, confirms as the input character string the candidate character string displayed at the disappearance position.

8. A character input device connected to a touch screen, the character input device comprising:

an input character reception component for displaying on the touch screen a key area in which a plurality of characters are arranged, and receiving as an input character a character that complies with a detection status of a touch point for the key area;

a candidate display component for displaying on the touch screen a candidate area that includes candidate character strings that match the input character received by the input character reception component; and a confirmation component for confirming as an input character string a specific candidate character string that complies with a detection status of a touch point for the candidate area, wherein the candidate display component has a first candidate area display component for displaying at a specific position on the touch screen a first band-shaped candidate area in which candidate character strings that match the input character received by the input character reception component are lined up, and a second candidate area display component for displaying, in response to a detection of a touch point at a display position of one of the candidate character strings within the first band-shaped candidate area, a second band-shaped candidate area in which candidate character strings that are allowed to be inputted following the candidate character string displayed at the detection position are lined up, so that the second band-shaped candidate area is adjacent to the first band-shaped candidate area in a width direction and matches an orientation of the first band-shaped candidate area, and the confirmation component, in response to a disappearance of the touch point that is detected in the first band-shaped candidate area at the display position of one of the candidate character strings within the area after moving to the second band-shaped candidate area, selects as the input character string a character string with a configuration following the candidate character string displayed at a disappearance position of the touch point in the second band-shaped candidate area after the candidate character string displayed at the position of the touch point within the first band-shaped candidate area when the second band-shaped candidate area is displayed.

9. An information processing device comprising a touch screen and a character input device, the character input device comprising:

an input character reception component for displaying on the touch screen a key area in which a plurality of characters are arranged, and receiving as an input character a character that complies with a detection status of a touch point for the key area;

a candidate display component for displaying on the touch screen a candidate area that includes candidate character strings that match the input character received by the input character reception component; and a confirmation component for confirming as an input character string a specific candidate character string that complies with a detection status of a touch point for the candidate area, wherein the input character reception component has a first key area display component for displaying at a specific position on the touch screen a first band-shaped key area in which representative characters of a plurality of character groups in which the representative characters are given one by one are lined up, and a second key area display component for displaying, in response to a detection of a touch point at a display position of one of the characters within the first band-shaped key area, a second band-shaped key area in which characters including representative characters in character groups in which the representative characters are the characters displayed at the detection position are lined up, so that the second band-shaped key area is adjacent to the first band-shaped key area in a width direction and matches an orientation of the first band-shaped key area, the candidate display component, in response to a movement of a touch point detected in the first band-shaped key area to a display position of one of the characters in the second band-shaped key area, displays a band-shaped candidate area in which candidate character strings that match the character displayed at that movement position are lined up, so that the band-shaped candidate area matches an orientation of the second band-shaped key area and is adjacent to the second band-shaped key area on the opposite side from the first band-shaped key area, and the confirmation component, in response to a disappearance of the touch point that moves to the second band-shaped key area at the display position of one of the candidate character strings after moving to the band-shaped candidate area, confirms as the input character string the candidate character string displayed at the disappearance position.

10. An information processing device comprising a touch screen and a character input device, the character input device comprising:

an input character reception component for displaying on the touch screen a key area in which a plurality of characters are arranged, and receiving as an input character a character that complies with a detection status of a touch point for the key area;

a candidate display component for displaying on the touch screen a candidate area that includes candidate character strings that match the input character received by the input character reception component; and a confirmation component for confirming as an input character string a specific candidate character string that complies with a detection status of a touch point for the candidate area, wherein the candidate display component has a first candidate area display component for displaying at a specific position on the touch screen a first band-shaped candidate area in which candidate character strings that match the input character received by the input character reception component are lined up, and a second candidate area display component for displaying, in response to a detection of a touch point at a display position of one of the candidate character strings within the first band-shaped candidate area, a second band-shaped candidate area in which candidate character strings that are allowed to be inputted following the candidate character string displayed at the movement position are lined up, so as to match an orientation of the first band-shaped candidate area and so as to be adjacent to the first band-shaped candidate area in a width direction, and the confirmation component selects as the input character string a character string with a configuration following the candidate character string displayed at a disappearance position of the touch point in the second band-shaped candidate area after the candidate character string displayed at the position of the touch point within the first band-shaped candidate area when the second band-shaped candidate area is displayed, in response to the disappearance of the touch point at the display position of one of the candidate character strings within the area after the touch point detected in the first band-shaped candidate area moves from the first band-shaped candidate area to the second band-shaped candidate area.

* * * * *